United States Patent [19]

Mann

[11] Patent Number: 5,636,161
[45] Date of Patent: Jun. 3, 1997

[54] EPROM BIT-LINE INTERFACE FOR IMPLEMENTING PROGRAMMING, VERIFICATION AND TESTING

[75] Inventor: Eric N. Mann, Issaquah, Wash.

[73] Assignee: Cypress Semiconductor Corporation, San Jose, Calif.

[21] Appl. No.: 549,919

[22] Filed: Oct. 30, 1995

[51] Int. Cl.$^6$ ........................................ G11C 7/00
[52] U.S. Cl. ........................ 365/185.21; 365/189.05; 365/185.22
[58] Field of Search ............... 365/185.21, 189.05, 365/185.22, 185.23

[56] References Cited

U.S. PATENT DOCUMENTS

| | | | |
|---|---|---|---|
| 5,339,276 | 8/1994 | Takasugi | 365/189.05 |
| 5,343,428 | 8/1994 | Pilo et al. | 365/189.05 |
| 5,424,996 | 6/1995 | Martin et al. | 365/189.05 |
| 5,430,688 | 7/1995 | Takasugi | 365/189.05 |
| 5,450,565 | 9/1995 | Nadir et al. | 365/189.05 |

*Primary Examiner*—David C. Nelms
*Assistant Examiner*—Michael T. Tran
*Attorney, Agent, or Firm*—Barnes, Kisselle, Raisch, Choate, Whittemore & Hulbert, P.C.

[57] ABSTRACT

The present invention provides an EPROM bit-line interface with multiple functions. The invention is constructed by combining a bit/sense amplifier with two transparent latches operating on opposite edges of a timing clock. The two transparent latches form a latch and a register for holding the contents of the EPROM during power down. A bit driver is enabled when it is desirable to program the EPROM. The first transparent latch captures the contents of the EPROM when the EPROM is powered down. The first transparent latch also forms the first half of a register for shifting the contents of the EPROM to an external device. The first transparent latch operates on the leading edge of a timing clock. The second transparent latch operates on the trailing edge of a timing clock. By combining two transparent latches in series, a shift register is implemented. The shift register is used to hold the programming information while the EPROM is programmed. The shift register also holds the programming information while the contents of the EPROM are read during verification. The contents of the shift register also appear at the output of the EPROM. This eliminates the need for a multiplexer to select between the output of a shift register or the output of an EPROM during functional testing.

17 Claims, 3 Drawing Sheets

/ 1

EPROM BIT-LINE INTERFACE FOR IMPLEMENTING PROGRAMMING, VERIFICATION AND TESTING

FIELD OF THE INVENTION

This invention relates to EPROM arrays generally, and more particularly to a bit-line interface for performing a variety of functions on an EPROM array.

BACKGROUND OF THE INVENTION

An erasable programmable read only memory (EPROM) generally requires various programming functions to be implemented including programming the EPROM, reading the contents of the EPROM, saving the contents of the EPROM while the EPROM is disabled for power saving purposes, shifting programming information into and out of the EPROM, and supplying data from either the EPROM or a programming register for functional testing of the device incorporating the EPROM. The prior art generally performs these functions by using a register for storing and verifying programming information, using a EPROM bit-line driver/sense amplifier for programming and reading, using a latch for capturing data when the array is disabled, and using a multiplexer to select the contents of the EPROM or register for functional testing of the device incorporating the EPROM. The prior art techniques for performing these functions required significant implementation of logic and wiring to interconnect the registers, multiplexers and EPROM arrays. The internal wiring required to interconnect these devices becomes a significant cost when the number "n", representing the width of the internal bus lines, gets large. This increase in the width of the data paths is inevitable with memory technology increasing at a rapid pace. For example, the model 2291 clock generator (available from the assignee of the present invention) uses two EPROM memory arrays. The first EPROM has a bus where n=18, while the second EPROM has a bus where n=76. The width of these buses can be a significant design consideration.

SUMMARY OF THE INVENTION

The present invention provides a EPROM bit-line interface with multiple functions. The invention is constructed by combining a Dit/sense amplifier with two transparent latches operating on opposite edges of a timing clock. The two transparent latches form a latch and a register for holding the contents of the EPROM during power down. A bit driver is enabled when it is desirable to program the EPROM. The first transparent latch captures the contents of the EPROM when the EPROM is powered down. The first transparent latch also forms the first half of a register for shifting the contents of the EPROM to an external device. The first transparent latch operates on the leading edge of a timing clock. The second transparent latch operates on the trailing edge of the timing clock. By combining two transparent latches in series, a shift register is implemented. The shift register is used to hold the programming information while the EPROM is programmed. The shift register also holds the programming information while the contents of the EPROM are read during verification. The contents of the shift register also appear at the output of the EPROM. This eliminates the need for a multiplexer to select between the output of a shift register or the output of an EPROM during functional testing.

BRIEF DESCRIPTION OF THE DRAWINGS

These and other objects, features and advantages of the present invention will be apparent from the following detailed description, the appended claims and the accompanying drawings in which:

DETAILED DESCRIPTION OF THE PREFERRED EMBODIMENT

Figure 1:
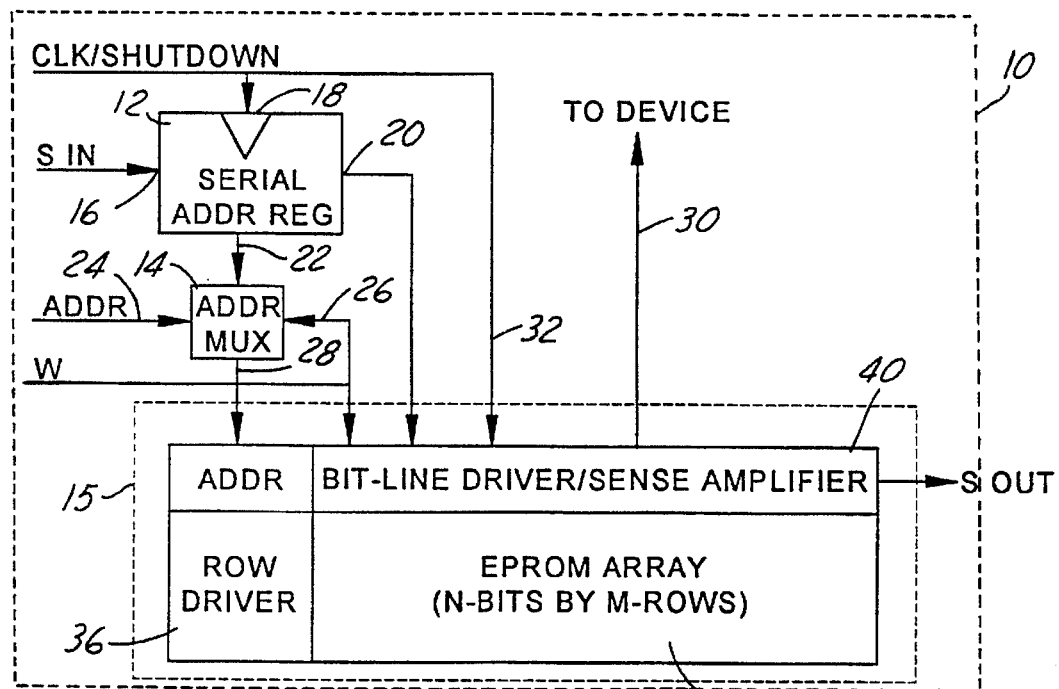
FIG. 1 is a block diagram showing the present invention as implemented with an EPROM array.

Referring to FIG. 1, an EPROM device 10 is shown comprising a serial address register 12, an address multiplexer 14 and a memory device 15. The serial address register 12 receives an input 16 from an external input source Sin. The serial address register 12 has a second input 18 that receives a signal from an external clock Clk. The serial adder register 12 has an output 20 that passes the external input source Sin to the memory device 15 after passing through a shift register, and a bus output 22 that sends information to the address multiplexer 14. The address multiplexer 14 has a bus input 24 that receives address information from the serial adder register 12. The address multiplexer 14 has an input 26 that receives a signal from an external write indictor W. The address multiplexer 14 has a bus output 28 that sends information to the memory device 15.

Figure 2:
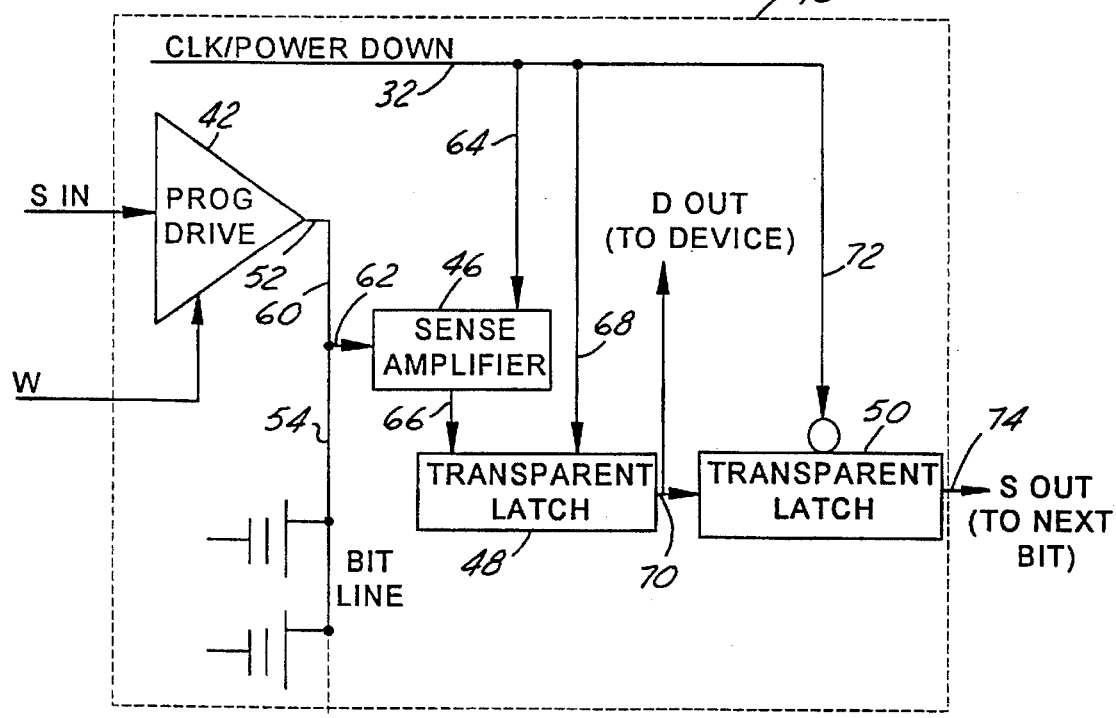
FIG. 2 is a block diagram of the preferred embodiment of the present invention.

The memory device 15 has a bus 30 that provides output information to other circuitry (not shown). The output information on bus 30 continues to be available after a power down of the memory device 15. The memory device 15 also has an output Sout that provides a registered output equal to the external input source Sin delayed by the shift register. The memory device 15 also has an input 32 from the external clock Clk. The memory device 15 generally comprises an address register 34, a row driver 36, an EPROM array 38 and a bit-line driver 40. The bit-line driver 40 receives inputs from input 26, input 32 and output 20. The bit-line driver 40 provides the output Sout, and the output bus 30. As a result, the bit-line driver 40 acts as a driver during programming of the EPROM array 30, as a register during reading of the EPROM array 30 and as a data latch. FIG. 2 describes the internal functioning of the bit-line driver 40.

Referring to FIG. 2, the bit-line driver 40 is shown with greater detail. The bit-line driver 40 generally comprises a program driver 42, a sense amplifier 46, a first transparent latch 48 and a second transparent latch 50. The program driver 42 receives an external input source Sin from the serial address register 12. The program driver 42 also receives an external write indicator signal W. The program driver 42 provides an output 52 that drives the bit-line 54 during programming. The output 52 of the program driver 42 is combined with the bit-line signal 54 to produce an output signal 60. The sense amplifier 46 has an input line 62 that receives the combined bit-line and program driver output signal 60. The sense amplifier 46 also has an input 64 that receives a signal from the external clock signal Clk 32. The sense amplifier 46 has a sense output 66 that is received by the first transparent latch 48. The sense amplifier 46 continuously monitors the input line 62 for voltage level. The sense amplifier 46 is configured having a predetermined threshold and will be triggered when the signal on the input line 62 exceeds the predetermined threshold. When the sense amplifier 46 is triggered, the sense output 66 changes state. The sense amplifier 46 converts the small voltage swing from signal 62 into a large voltage swing on signal 66 which is suitable for presentation to the first transparent latch 48. Signal 64 turns off the sense amplifier 46 for power reduction. The transparent latch 48 has an input 68 that receives the external clock signal Clk. The transparent latch 48 has a hold output 70 that is sent to both the second transparent latch 50 as well as to an external device. The transparent latch 50 has an input 72 that receives an external clock signal Clk. The transparent latch 50 also has a register output 74 that represents the output signal Sout.

The first and second transparent latches 48 and 50 are each level triggered devices, as opposed to edge triggered devices such as a D-latch. When the first and second transparent latches 48 and 50 are connected in series, they act in a similar fashion to a D-latch which provides a register effect. The hold output 70, which is sent to the external device, is on the same clock cycle as, or is synchronized with, the output 66 presented to the first transparent latch 48. The register output 74 of the second transparent latch 50 is on the opposite clock edge, or is delayed ½ clock, from the sense output 66 presented to the first transparent latch 48. A D-latch could be substituted in place of the first and second transparent latches 48 and 50, but could only produce the register output 74. This would eliminate the possibility of producing the latching effect of the bit-line driver 40 at the hold output 70. The first and second transparent latches 48 and 50 act as a shift register that is used to hold the programing information of the memory device 15 during programming and for reading the contents of the memory device 15 during verification. It should be appreciated, that the implementation of the first transparent latch 48 and the second transparent latch 50 is the simplest way to produce both the hold output 70, which is a latched output equal to the external input source Sin, and the register output 74 which is a registered output equal to the external input source Sin. Other latches could be implemented to produce the bit-line driver 40 including using latches composed of two clocked inverters in combination with one clock inverter. A pass-transistor type latch could also be substituted to produce the bit-line driver 40. Additional substitutions to the dual transparent latch system of the bit-line driver 40 would be to implement NAND or NOR-type latches. Use of these alternate latching systems, although most likely increasing the complexity and size of the device 10, would not depart from the spirit of the invention.

The bit-line driver 40 described in FIG. 1 and FIG. 2 generally operates by loading the first and second transparent latches 48 and 50 by enabling the program driver 42 with the write indicator signal W. This causes the Sin signal to be driven out of the bit-line signal 54 which is presented to the sense amplifier 46 and the transparent latches 48 and 50 connected together as a shift register. The Sout signal 74 then drives Sin of the next bit, forming a shift register chain equal to the number of bit-lines in the array. The external clock Clk is used to shift data into the first and second transparent latches 48 and 50. When the shifting is complete, the data in the first and second transparent latches 48 and 50 is present at the hold output 70. Thus the external device connected to the EPROM array 38 can be controlled without any additional registers and multiplexers.

The program driver 42 forces the bit-line 54 to the proper state so programming can be accomplished by applying appropriate voltage levels to the row driver 36 and program driver 42. The data in the EPROM array 38 is latched into the first transparent latch by asserting the external Clk and the external write indicator signal W to a not active state. The EPROM array 38 can now be disabled without disturbing the hold output 70. Additionally, the write indicator signal W can be asserted which now connects succeeding bit drivers with their predecessors to once again form the shift register which is used to serially transfer the contents of the EPROM array 38 to the external device for verification purposes.

Figure 3:
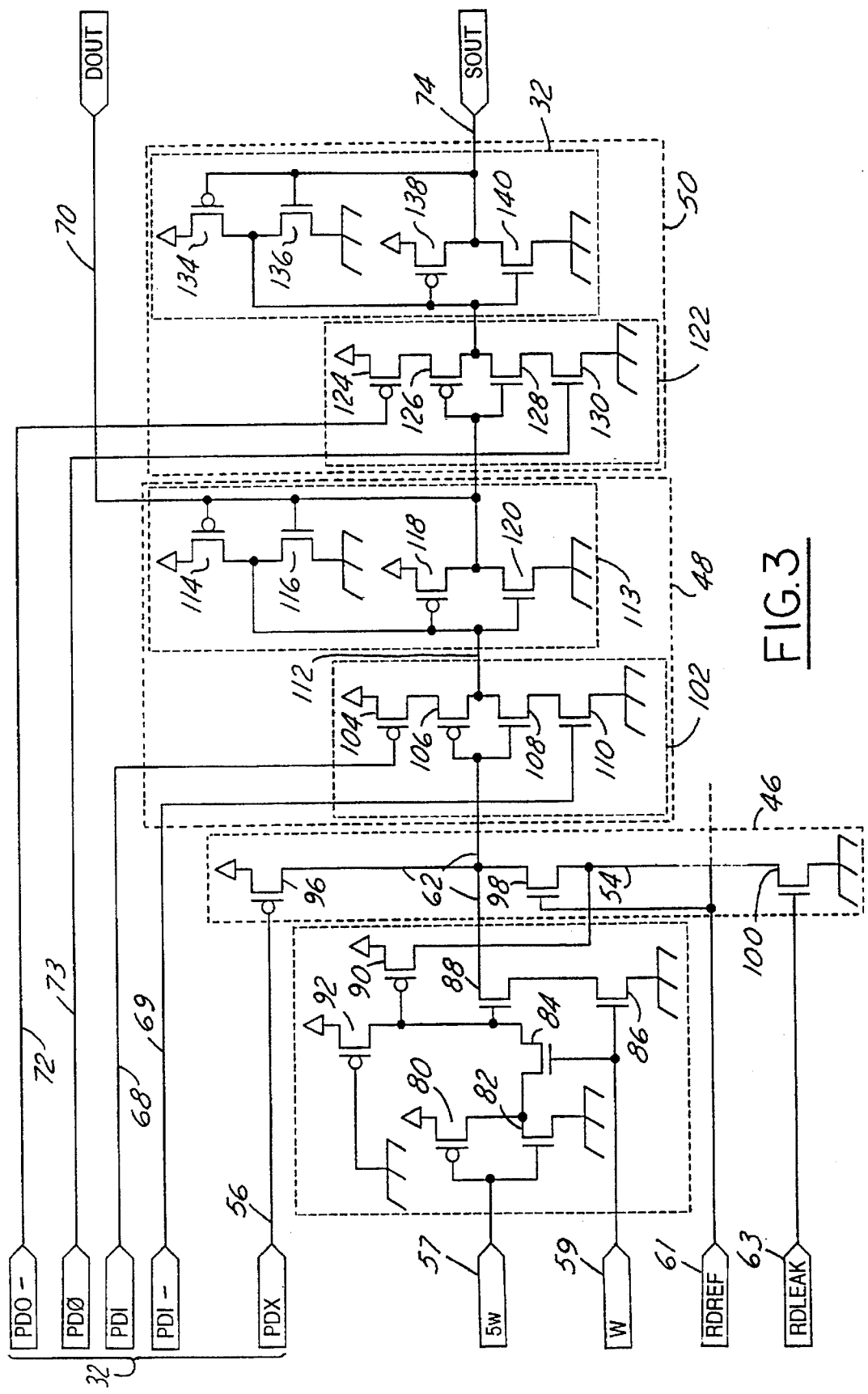
FIG. 3 is a schematic diagram of the preferred embodiment of the present invention implemented using CMOS technology.
Figure 4:
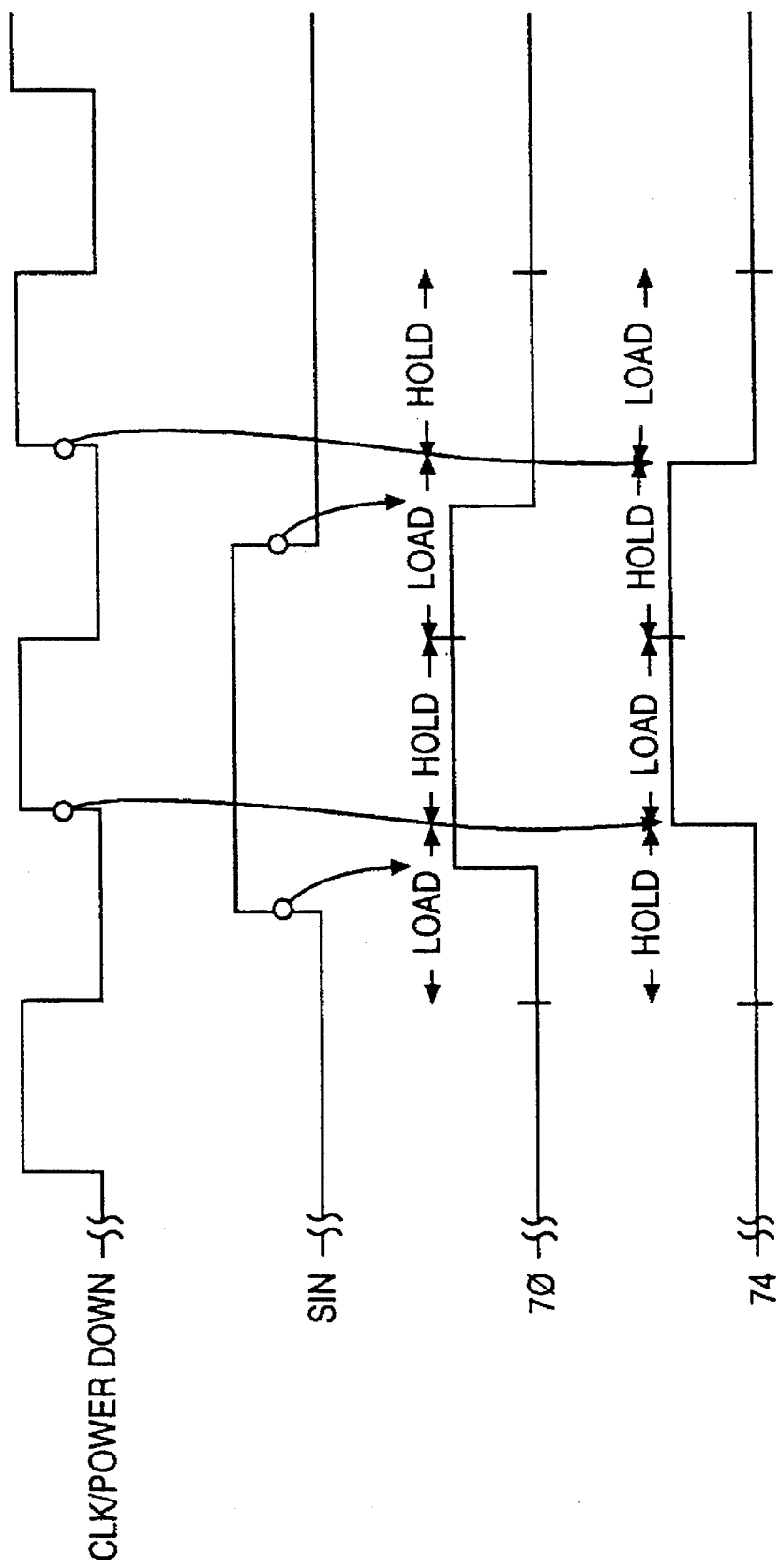
FIG. 4 is a timing diagram illustrating various signals of the present invention.

Referring to FIG. 3, a schematic diagram of the components of FIG. 2 is shown. FIG. 3 shows an implementation of the device 10 using complementary metal oxide semiconductor (CMOS) transistors. The clock signal bus 32 is the logical equivalent of the external clock signal Clk 32 of FIG. 2 and consists of five clock signals which are produced from the clock signal Clk 32 shown in FIG. 2. Signals PDX 56, PD1 68 and PD0 73 are logically equivalent to the clock signal 32, while signals PD1-69 and PD0-72 are logically equivalent to an inverted version of the clock signal 32. These signals are generated by a well known two-phase non-overlapping clock generator circuit as described on page 229 of "Introduction to VLSI Systems" by Mead and Conway. The clock signal bus 32 performs a plurality of functions. When low (PDX 56, PD1 68 and PD0 73 low and PD1-69 and PD0-72 high) the sense amplifier 46 is active and the first transparent latch 48 is in the pass-through or transparent mode so the signal present on line 62 is also present on the device out signal 70. The second transparent latch 50 is in the hold mode so the Sout signal 74 reflects the state the device out signal (70) at the time the clock signal bus 32 changed from high to low. When the clock signal bus 32 is high (PDX 56, PD1 69 and PD0 73 high and PD1-69 and PD0-72 low) the sense amplifier 46 is turned off to reduce power, the first transparent latch 48 is in the hold state with the device output signal 70 reflecting the state of the sense amplifier output 62 at the time the clock bus signal 32 changed from low to high. The second transparent latch 50 is in the pass-through mode so the Sout signal 74 reflects the state of the device out 70 signal.

The program driver 42 comprises seven transistors 80, 82, 84, 86 and 88, 90 and 92. The transistor 80 is a PMOS exhaust type device which has an inverted gate that receives a signal from the external input source Sin. The source of transistor 80 is coupled to an external power source. The drain of the transistor 80 is coupled to a drain of the transistor 82 which is an NMOS enhancement mode device. The transistors 80 and 82 form an inverter. A gate of the transistor 82 receives a signal from the external input source Sin. A source of transistor 82 is grounded. A drain of transistor 84 is coupled to the drain of transistor 82. A gate of transistor 84 receives a signal from the external write indicator signal W which is also received by a gate of transistor 86. A source of transistor 86 is grounded, while a drain of transistor 86 is coupled to a source of transistor 88. A gate of transistor 88 is coupled to a drain of transistor 84. A drain of transistor 88 is coupled to the level shifted bit-line 62. A gate of transistor 88 is coupled to an inverted gate of transistor 90 as well as a drain of transistor 92. A drain of transistor 90 is coupled to the bit-line 54, while a source of transistor 90 is coupled to the external power supply. An inverted gate of transistor 92 is grounded while a source of transistor 92 is coupled to the external power supply. Device 92 forms a weak pull-up device. Transistors 96, 98 and 100 form the sense amplifier 46. The transistors 80 through 92 implement the program driver 42 which provides an output only when the external write indicator signal W is asserted. When this happens, the input signal Sin is presented on the bit-line 54. The transistor 96 has an inverted gate which receives a signal from the external clock Clk. The drain of transistor 96 provides a pull-up load on the bit-line output 62. A transistor 98 is configured as a grounded gate device and serves as a level shifter to convert the small swing bit-line voltage 54 to a large swing signal 62. The transistor 98 is biased at approximately 2 times the device threshold voltage Vtn. The transistor 98 serves the purpose of reducing the voltage on the bit-line 54 during read operations to prevent Fowler-Nordheim induced read drain disturbances. A transistor 100 prevents leakage from transistors 90 and 98 from causing the bit-line to drift above the desired value. This transistor is biased so its current is approximately ⅕ the current of the pull-up transistor 96.

A clocked inverter 102 is formed by four transistors 104, 106, 108 and 110. The transistor 104 has an inverted gate that receives an input from an inverted version of the external clock Clk. Similarly, the transistor 110 has a gate that receives the signal from the external clock Clk. The transistor 106 and the transistor 108 each have gates that received an input from the bit-line 54. The drain of transistor 106 and the drain of transistor 108 are coupled together and provide an output 112. The sources and drains of transistors 104 through 110 are cascaded together and connected between the external voltage source and ground.

A latch 113 receives the output signal 112. The latch 113 is comprised of four transistors 114, 116, 118 and 120. Transistors 118 and 120 form an inverter which receive the output signal 112 from the clocked inverter 102. Transistors 118 and 120 receive the input signal 112 at an inverted gate and a gate respectively. An inverted gate of transistor 114 and a gate of transistor 116 together with the drain of transistor 118 and transistor 120 form the device output signal 70. The source of transistor 114 and 118 are each connected to the external power supply. The source of transistors 116 and 120 are grounded. The transistors 114–120 form the latch 113, with transistors 114 and 116 providing a weak feedback inverter. A transparent latch 48 consisting of the clocked inverter 102 and latch 113 is formed by the stronger clocked inverter 113 overpowering the inverter formed by the transistors 114 and 116. Therefore, the transparent inverter controls the contents of latch when the latch is enabled.

A clocked inverter 122 is formed by four transistors 124, 126, 128 and 130. The inverter 122 is configured similarly to the clocked inverter 102. A latch 132 is comprised of four transistors 134, 136, 138 and 140. The inverter 132 is configured similarly to the latch 113. The clocked inverter 122 and the latch 132 combine to form the second transparent latch 48. It should be appreciated that while CMOS transistors are shown in the FIG. 3 implementation, other types of transistors could be substituted without departing from the spirit of the present invention.

While an EPROM storage array has been shown, it is understood that the invention could be extended to other types of memory arrays such as EEPROM, flash memory and RAM storage arrays and these other storage means are within the spirit of the invention.

It is to be understood that modifications to the invention might occur to one skilled in the field of the invention within the scope of the appended claims.

I claim:

1. A circuit for implementing programing, verification and testing of a memory array comprising:

a program driver having a signal input connected to an external input signal and an enable input connected to an external write enable signal, said program driver has a driver output that produces a signal when said enable input is present;

a sense amplifier having a driver input connected to said driver output and a sense output, said sense amplifier for receiving said driver output when said signal is present at said driver input; and storage means comprising a first and second transparent latch connected in series each having an input and an output, the input of said first transparent latch is connected to said sense output, the output of the first transparent latch is connected to the input of the second transparent latch and represents a hold output of the storage means that is equal to and synchronous with said sense output, the output of the second transparent latch provides a register output that is equal to but delayed from said sense output.

2. The circuit according to claim 1 wherein said program driver, said sense amplifier and said storage means are implemented using MOS logic.

3. The circuit according to claim 1 wherein said program driver, said sense amplifier and said storage means are implemented using CMOS logic.

4. The circuit according to claim 1 wherein said program driver, said sense amplifier and said storage means are implemented using BiCMOS logic.

5. The circuit according to claim 1 wherein said program driver, said sense amplifier and said storage means are implemented using Bipolar logic.

6. The circuit according to claim 1 wherein said first and second transparent latches each comprise a first clocked inverter and a first and second conventional inverter.

7. A circuit for implementing programming, verification and testing of a memory array comprising:

a program driver having a signal input connected to an external input signal and an enable input connected to an external write enable signal, said program driver has a driver output that produces a signal when said enable input is present;

a bit-line having a bit input connected to said driver output and a bit output, said bit-line for receiving program information from said signal input when said signal is present at said driver output;

a sense amplifier having a bit input connected to said bit output and a sense output, said sense amplifier for receiving said information from the bit output only when said signal is present at said bit input; and storage means comprising a first and second transparent latch connected in series each having an input and an output, said input of said first transparent latch is connected to said sense output, the output of the first transparent latch is connected to the input of the second transparent latch and represents a hold output of the storage means that is equal to and synchronous with said sense output, the output of the second transparent latch provides a register output that is equal to but delayed from said sense output.

8. The circuit according to claim 7 wherein said program driver, said sense amplifier and said storage means are implemented using MOS logic.

9. The circuit according to claim 7 wherein said program driver, said sense amplifier and said storage means are implemented using CMOS logic.

10. The circuit according to claim 7 wherein said program driver, said sense amplifier and said storage means are implemented using BiCMOS logic.

11. The circuit according to claim 7 wherein said program driver, said sense amplifier and said storage means are implemented using Bipolar logic.

12. The circuit according to claim 7 wherein said first and second transparent latches further comprise a first clocked inverter and a first and second conventional inverter.

13. A circuit for implementing programming, verification and testing of a memory array comprising:

a program driver having a signal input connected to an external input signal and an enable input connected to an external write enable signal, said program driver has a driver output that produces a signal when said enable input is present;

a bit-line having a bit input connected to said driver output, a bit output and a line input connected to said load output, said bit-line for receiving program information from said signal input when said signal is present at said driver output and said load signal is present at said line input;

a sense amplifier having a bit input connected to said bit output and a sense output, said sense amplifier for receiving said information from the bit output only when said signal is present at said bit input and having the ability to turn off for power consumption reduction; and storage means comprising a first and second transparent latch connected in series each having an input and an output, said input of said first transparent latch is connected to said sense output, the output of the first transparent latch is connected to the input of the second transparent latch and represents a hold output of the storage means that is equal to end synchronous with said sense output, the output of the second transparent latch provides a register output that is equal to but delayed from said sense output.

14. The circuit according to claim 13 wherein said program driver, said sense amplifier and said storage means are implemented using MOS logic.

15. The circuit according to claim 13 wherein said program driver, said sense amplifier and said storage means are implemented using CMOS logic.

16. The circuit according to claim 13 wherein said program driver, said sense amplifier and said storage means are implemented using BiCMOS logic.

17. The circuit according to claim 13 wherein said program driver, said sense amplifier and said storage means are implemented using Bipolar logic.

* * * * *